(12) United States Patent
Noda et al.

(10) Patent No.: US 11,402,591 B2
(45) Date of Patent: Aug. 2, 2022

(54) OPTICAL COUPLING DEVICE

(71) Applicants: Kabushiki Kaisha Toshiba, Tokyo (JP); Toshiba Electronic Devices & Storage Corporation, Tokyo (JP)

(72) Inventors: Takamitsu Noda, Sagamihara Kanagawa (JP); Yoshiko Takahashi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/201,195

(22) Filed: Mar. 15, 2021

(65) Prior Publication Data

US 2021/0294049 A1    Sep. 23, 2021

(30) Foreign Application Priority Data

Mar. 19, 2020 (JP) .............................. JP2020-049998

(51) Int. Cl.
*G02B 6/42* (2006.01)
*H01L 31/0203* (2014.01)

(52) U.S. Cl.
CPC ......... *G02B 6/4204* (2013.01); *G02B 6/4253* (2013.01); *H01L 31/0203* (2013.01)

(58) Field of Classification Search
CPC . G02B 6/4204; G02B 6/4253; H01L 31/0203; H01L 33/62; H01L 31/167; H01L 25/167
See application file for complete search history.

(56) References Cited

U.S. PATENT DOCUMENTS

| | | | |
|---|---|---|---|
| 9,559,787 B2 * | 1/2017 | Yaginuma | ............... H01L 31/14 |
| 2013/0109115 A1 * | 5/2013 | Nagafuchi | ............ H01L 31/173 |
| | | | 438/25 |
| 2014/0054614 A1 * | 2/2014 | Tanaka | ..................... H01L 31/16 |
| | | | 257/82 |
| 2018/0253005 A1 * | 9/2018 | Huang | .................. G03F 7/0387 |

FOREIGN PATENT DOCUMENTS

| | | |
|---|---|---|
| JP | 2005-259876 A | 9/2005 |
| JP | 2014-220275 A | 11/2014 |
| JP | 2014-220339 A | 11/2014 |
| JP | 5692971 B2 | 4/2015 |
| JP | 2015-195401 A | 11/2015 |
| JP | 2016-201450 A | 12/2016 |

* cited by examiner

*Primary Examiner* — Ellen E Kim
(74) *Attorney, Agent, or Firm* — Allen & Overy LLP

(57) ABSTRACT

An optical coupling device of an embodiment includes: a first lead frame; a light emitting element provided on the first lead frame; a second lead frame; a light receiving element provided on the second lead frame and facing the light emitting element; a polyimide resin covering a light emitting surface of the light emitting element; a transparent resin portion provided between the light emitting element and the light receiving element; and a light-shielding resin molded body accommodating the light emitting element and the light receiving element.

13 Claims, 2 Drawing Sheets

OPTICAL COUPLING DEVICE

CROSS-REFERENCE TO RELATED APPLICATION

This application is based upon and claims the benefit of priority from Japanese Patent Application No. 2020-049998, filed on Mar. 19, 2020, the entire contents of which are incorporated herein by reference.

FIELD

Embodiments described herein relate generally to an optical coupling device.

BACKGROUND

An optical coupling device is also called a photocoupler, and includes a light emitting element, a light receiving element, a lead frame for mounting these chips, and an outer resin that accommodates these light emitting element, light receiving element, and lead frame, and the inside of the optical coupling device is filled with an inner resin. The light emitting element and the light receiving element are covered with the inner resin.

DETAILED DESCRIPTION

Figure 1:
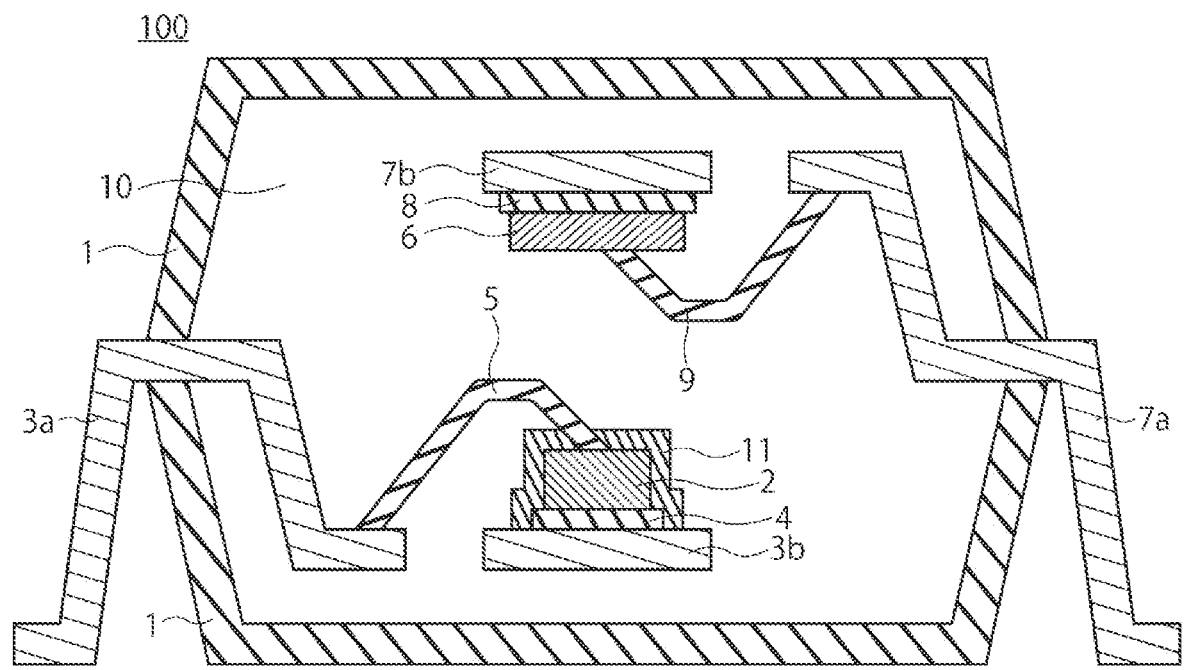
FIG. 1 is a conceptual cross-sectional view of an optical coupling device of an embodiment.

An optical coupling device of an embodiment includes: a first lead frame; a light emitting element provided on the first lead frame; a second lead frame; a light receiving element provided on the second lead frame and facing the light emitting element; a polyimide resin covering a light emitting surface of the light emitting element; a transparent resin portion provided between the light emitting element and the light receiving element; and a light-shielding resin molded body accommodating the light emitting element and the light receiving element.

Hereinafter, embodiments of the present disclosure will be described with reference to the drawings. In the drawings attached to this specification, for easy illustrations and understandings, the scale, the dimensional ratio of the length and the breadth, and the like are appropriately changed and exaggerated from those of the components in practice.

Hereinafter, the embodiments will be described with reference to the drawings. In the drawings, the same or similar parts are denoted by the same or similar reference signs.

In this specification, the same or similar members are denoted by the same reference signs and descriptions thereof may not be repeated.

In this specification, in order to indicate positional relations between the components and the like, the upward direction in the drawings is described as "upper", and a downward direction in the drawings is described as "lower". In this specification, "upper" and "lower" are not always indicating the relationship with the direction of gravity.

Further, it is assumed that terms of, for example, "parallel", "orthogonal", "identical", and the like, which are used in this specification and are used for specifying the shape, geometrical conditions, and the degrees thereof, and values of the length, the angle, and the like are interpreted to include a range in which the similar function may be expected, without being bound by strict meanings.

First Embodiment

FIG. 1 is a conceptual cross-sectional view of an optical coupling device 100. The optical coupling device 100 of FIG. 1 includes a light-shielding resin molded body (outer resin) 1, a light emitting element 2, a first lead frame 3, a first adhesive layer 4, a first bonding wire 5, a light receiving element 6, a second lead frame 7, a second adhesive layer 8, a second bonding wire 9, a transparent resin portion 10, and a polyimide resin 11.

The light-shielding resin molded body 1 is an opaque (for example, black or white) resin composition. The light-shielding resin molded body 1 is a so-called outer resin. The light-shielding resin molded body 1 consists of, for example, an epoxy resin and an inorganic filler. The light-shielding resin molded body 1 is also an exterior material of the optical coupling device 100, and the light emitting element 2, the first lead frame 3, the first adhesive layer 4, the first bonding wire 5, the light receiving element 6, the second lead frame 7, the second adhesive layer 8, the second bonding wire 9, the transparent resin portion 10, and the polyimide resin 11 are accommodated inside the light-shielding resin molded body 1. The light-shielding resin molded body 1 blocks external light from the outside of the optical coupling device 100, and prevents the light receiving element 6 from receiving the external light.

The light shielding property in this case means the light with wavelength be the same with light emitting element 2 could not transmit into the device.

The light emitting element 2 is a semiconductor element that emits light by an electric signal from the outside. The light emitting element 2 is, for example, a light emitting diode. The light emitting element 2 could be a chip which include a light emitting element mounted on a substrate with circuits in one package system. The light emitted by the light emitting element 2 is received by the light receiving element 6 arranged so as to face the light emitting element 2. The light emitting element 2 is fixed to the first lead frame 3 via the adhesive layer 4. A light emitting surface of the light emitting element 2 is included in a surface of the light emitting element 2 facing the light receiving element 6.

The first lead frame 3 is a support of the light emitting element 2 and is a control-side terminal of a switch of the optical coupling device 100. The first lead frame 3 is partially exposed to the outside of the optical coupling device 100 and is a terminal of the optical coupling device 100. The first lead frame 3 is consists of, for example, metal such as copper or an alloy containing copper or iron. A Ni intermediate barrier layer may be formed on the first lead frame 3, and Pd plating may be applied on the intermediate barrier layer. The first lead frame 3 can be divided into a terminal side 3a and a support side 3b of the light emitting element 2. The terminal side 3a of the first lead frame 3 and a terminal side 7a of the second lead frame 7 are symmetrically arranged. The support side 3b of the first lead frame 3 and a support side 7b of the second lead frame 7 are arranged so as to face each other.

As illustrated in FIG. 1, the first lead frame 3 is preferably divided into the terminal side 3a of the optical coupling device 100 and the support side 3b of the light emitting element 2. If the first lead frame 3 is divided, it is difficult for air to reach the light emitting element 2 via the first lead frame 3, so that oxidation of the resin around the light emitting element 2 can be suppressed.

The adhesive layer 4 is provided between the light emitting element 2 and the first lead frame 3, and causes the light emitting element 2 and the first lead frame 3 to adhere to each other. The adhesive layer 4 is, for example, a coating film or a film-like coating of adhesive.

The first bonding wire 5 is a wiring that electrically connects the light emitting element 2 and the first lead frame 3. The first bonding wire 5 is, for example, an Au wire.

The light receiving element 6 is an element that receives light emitted by the light emitting element 2. The on and off of a circuit depends on the amount of light received by the light receiving element 6. The light receiving element 6 is connected to a peripheral circuit such as a MOSFET. A photodiode, a phototransistor, a light receiving IC, or the like is used as the light receiving element 6. The light receiving element 6 is connected to the second lead frame 7 via the adhesive layer 8. A light receiving surface of the light receiving element 6 is included in a surface where the light receiving element 6 faces the light emitting element 2.

The second lead frame 7 is a support for the light receiving element 6. A portion of the second lead frame 7 exposed to the outside of the optical coupling device 100 is a terminal on a circuit side that is switch-controlled. The second lead frame 7 is partially exposed to the outside of the optical coupling device 100 and is a terminal of the optical coupling device 100. The second lead frame 7 is consists of, for example, metal such as copper or an alloy containing copper or iron. A Ni intermediate barrier layer may be formed on the second lead frame 7, and Pd plating may be applied on the intermediate barrier layer. The second lead frame 7 may be divided into the terminal side 7a and the support side 7b of the light receiving element 6.

As illustrated in FIG. 1, the second lead frame 7 is preferably divided into the terminal side 7a of the optical coupling device 100 and the support side 7b of the light receiving element 6. If the second lead frame 7 is divided, it is difficult for air, which has entered the optical coupling device 100 via the second lead frame 7, to reach the light receiving element 6 through the second lead frame 7, so that the oxidation of the resin around the light receiving element 6 can be suppressed.

The adhesive layer 8 is provided between the light receiving element 6 and the second lead frame 7, and causes the light receiving element 6 and the second lead frame 7 to adhere to each other. The adhesive layer 8 is, for example, a coating film or a film-like adhesive.

The second bonding wire 9 is a wiring that electrically connects the light receiving element 6 and the second lead frame 7. The second bonding wire 9 is, for example, an Au wire. When the light receiving element 6 includes a peripheral circuit, the light receiving element 6, the peripheral circuit, and the second lead frame 7 are electrically connected by the second bonding wire 9.

The transparent resin portion 10 is provided between the light emitting element 2 and the light receiving element 6. The transparent resin portion 10 is a so-called inner resin. The transparency of the transparent resin portion 10 represents the passage of light emitted from the light emitting element 2. The transparent resin portion 10 includes, for example, epoxy resin and inorganic fillers. The transparent resin portion 10 is consists of, for example, epoxy resin and inorganic fillers. It is preferable that the transparent resin portion 10 be provided inside the optical coupling device 100 and fill the inside of the optical coupling device 100.

The polyimide resin 11 covers the light emitting surface of the light emitting element 2. When the light emitting surface of the light emitting element 2 is covered by the polyimide resin 11, the light emitting surface is protected, and the adhesion with the transparent resin portion 10 is enhanced. The polyimide resin 11 suppresses stress from the transparent resin portion 10 and protects the light emitting element 2. The polyimide resin 11 is in close contact with the light emitting element 2 and the transparent resin portion 10, and there is no gap between the light emitting element 2 and the polyimide resin 11 and between the light receiving element 6 and the polyimide resin 11.

If a ratio of the inorganic filler in the transparent resin portion 10 is low, an elastic modulus becomes low, but the transparent resin portion 10 easily expands, which is not preferable from the viewpoint of adhesion in the optical coupling device 100. It is preferable that the inorganic filler accounts for 70 wt % or more and 90 wt % or less of the transparent resin portion 10. It is preferable that the transparent resin portion 10 not include the polyimide resin 11. Specifically, an amount of the polyimide resin in the transparent resin portion 10 is preferably 1 wt % or less.

Since the light emitting element 2 is likely to be destroyed easily, it is known to directly cover the light emitting element 2 with a soft silicone resin (not containing an imide group) called a potting resin for protection. However, the silicone resin is likely to expand thermally so that a gap is generated between the transparent resin portion 10 and the silicone resin, and thus, the amount of light reaching the light receiving element 6 from the light emitting element 2 decreases. In addition, air that has entered from the outside of the optical coupling device 100 is likely to accumulate between the silicone resin and the transparent resin portion 10, and the amount of light reaching the light receiving element 6 from the light emitting element 2 decreases due to oxidative discoloration of the transparent resin portion 10. The polyimide resin 11 is generally yellow or brown, and thus, easily absorbs the light emitted by the light emitting element 2. In an optical coupling device of a low withstand voltage type with a short distance between a light emitting surface and a light receiving surface, the influence of the decrease in the amount of light is small. In an optical coupling device of a high withstand voltage type with a long distance between a light emitting surface and a light receiving surface, the decrease in the amount of light becomes remarkable, and characteristics of the optical coupling device deteriorate if the entire portion between the light emitting surface of the light emitting element 2 and the light receiving surface of the light receiving element 6 is filled with the polyimide resin 11. As the polyimide resin 11 is provided on the light emitting surface of the light emitting element 2, the deterioration of the characteristics of the optical coupling device 100 is suppressed, and the reliability is improved.

It is preferable that the polyimide resin 11 contain at least one selected from a group consisting of a polyimide resin, a polyamide-imide resin, and a polyimide silicone. If a ratio of a polyimide-based material contained in the polyimide resin 11 is low, an advantage of the polyimide resin 11 decreases. Thus, it is preferable that 90 wt % or more of polyimide resin 11 be one or more selected from the group consisting of the polyimide resin, the polyamide-imide resin and the polyimide silicone. It is more preferable that 100 wt % of polyimide resin 11 be one or more selected from the group consisting of the polyimide resin, the polyamide-imide resin and the polyimide silicone.

When the polyimide resin 11 is provided on a surface of the light emitting element 2 at least on a light emitting layer, stress of the light emitting layer of the light emitting element 2 can be mitigated, and the destruction of the light emitting element 2 can be prevented.

If the polyimide resin 11 is too thick, most of the light emitted from the light emitting element 2 is absorbed, and thus, the thickness of the polyimide resin 11 is preferably 50 µm or less. The polyimide resin 11 may be a coating film or a film formed by a spray method. In addition, the polyimide resin 11 may be formed by attaching a film. It is difficult to perform coating because the viscosity of a solution for forming the polyimide resin 11 is high. If the thickness of the polyimide resin 11 is less than 1 µm, it is not preferable because a film with holes is likely to be formed due to poor formation. Therefore, the thickness of the polyimide resin 11 is preferably 1 µm or more and 50 µm or less.

The optical coupling device 100 of the embodiment is preferably a high withstand voltage type, and a distance between the first bonding wire 5 and the second bonding wire 9, which is the distance between the light emitting element 2 side and the light receiving element 6 side, is preferably 300 µm or more. From the same viewpoint, the thickness of the transparent resin portion 10 between the light emitting element 2 and the light receiving element 6 is preferably 300 µm or more. A withstand voltage becomes low if the distance is too short, and a package size becomes too large if the distance is too long. Therefore, the distance between the first bonding wire 5 and the second bonding wire 9 and the thickness of the transparent resin portion 10 between the light emitting element 2 and the light receiving element 6 are preferably 1000 µm or less.

From the viewpoint of adhesion, it is preferable that the polyimide resin 11 be also formed on one or more selected from a group consisting of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1. From the above viewpoint, it is preferable that the polyimide resin 11 be also formed on two or more selected from a group consisting of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1. From the above viewpoint, it is preferable that the polyimide resin 11 be also formed on all of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1.

Considering the adhesion, it is preferable that the polyimide resin 11 is in direct contact with the light emitting element 2. From the above viewpoint, it is preferable that the polyimide resin 11 is also in direct contact with one or more selected from a group consisting of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1. From the above viewpoint, it is preferable that the polyimide resin 11 is also in direct contact with two or more selected from a group consisting of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1. From the above viewpoint, it is preferable that the polyimide resin 11 is also in direct contact with all of a non-light emitting surface excluding the light emitting surface of the light emitting element 2, a surface of the first lead frame 3, a surface of the second lead frame 7, a surface of the light receiving element 6, and an inner wall surface of the light-shielding resin molded body 1.

When the polyimide resin 11 is provided on the light emitting surface of the light emitting element 2, the characteristics of the optical coupling device 100 are less likely to deteriorate even at a high temperature. The optical coupling device sometimes deteriorates at a high temperature due to the discoloration of the transparent resin portion 10. As the structure of the embodiment is adopted, an increase in threshold current on an input side is suppressed even if the optical coupling device 100 is kept at a high temperature for a long period of time, and the characteristics are less likely to deteriorate.

Note that the number and arrangement of lead frames provided in the optical coupling device 100 are appropriately selected according to a package. In addition, the shape of the optical coupling device 100 may be a surface mounting type such as a small outline package (SOP) or an insertion mounting type such as a dual inline package (DIP). In addition, a multi-channel configuration may be adopted in which a plurality of the light emitting elements 2 and light receiving elements 6 are built in the single optical coupling device 100. When the configuration of the embodiment is adopted for the multi-channel optical coupling device, a characteristic difference between channels can be suppressed, which contributes to the improvement of reliability.

Second Embodiment

Figure 2:
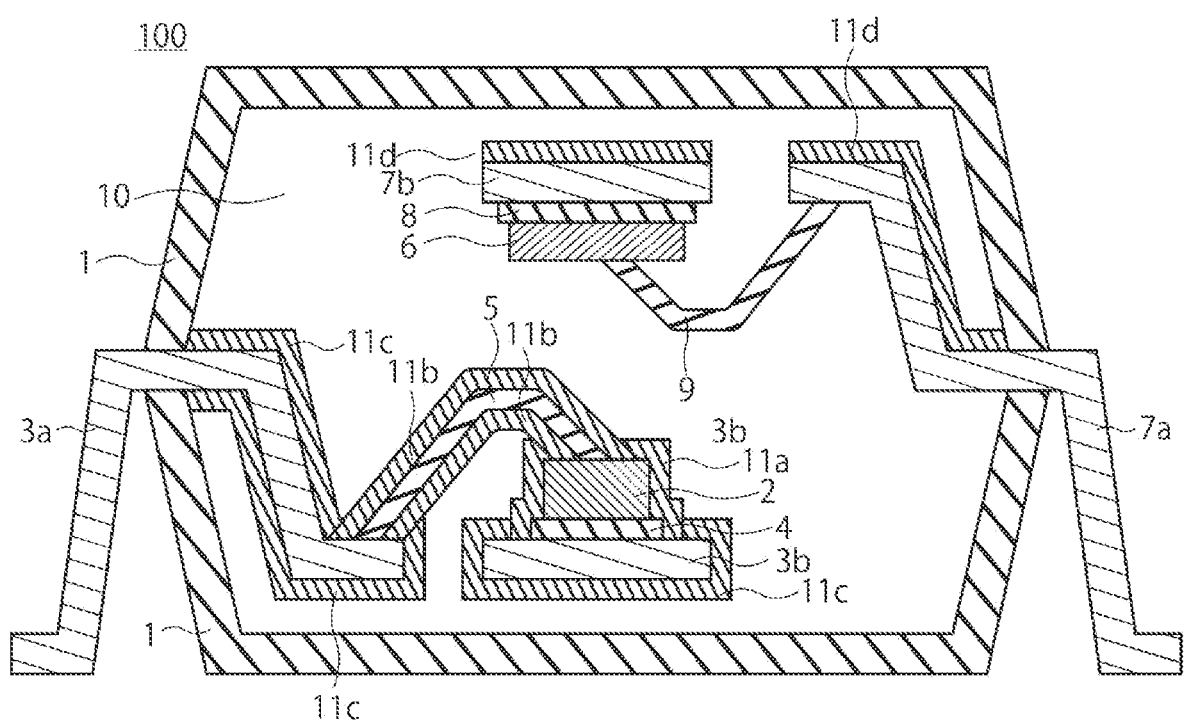
FIG. 2 is a conceptual cross-sectional view of the optical coupling device of the embodiment.

A second embodiment relates to an optical coupling device. The optical coupling device of the second embodiment is a modification of the optical coupling device 100 of the first embodiment. The description of contents common between the second embodiment and the first embodiment will be omitted. FIG. 2 illustrates a conceptual cross-sectional view of an optical coupling device 101 of the second embodiment.

In the optical coupling device 101 of FIG. 2, a polyimide resin 11a is provided on a light emitting surface and a non-light emitting surface of the light emitting element 2 and a side surface of the adhesive layer 4, a polyimide resin 11b is provided on a surface of the first bonding wire 5, a polyimide resin 11c is provided on a surface of the first lead frame 3, and a polyimide resin 11d is provided on a surface of the second lead frame 7.

Since the polyimide resin 11 has a high binding property, the adhesion between members is improved inside the optical coupling device 101 by providing the polyimide resin 11 in a portion other than an optical path of the light emitting element 2 and the light receiving element 6, and it is possible to prevent air from entering into the optical coupling device 101 and to prevent the deterioration of resin. When the polyimide resins 11 are provided on the surfaces of the light emitting element 2, the first lead frame 3, the first bonding wire 5, the light receiving element 6, the second lead frame 7, and the second bonding wire 9, respectively, the insulation between members is enhanced, which contributes to the improvement of withstand voltage and characteristics.

A space between the light-shielding resin molded body 1 and the first lead frame 3 is likely to serve as an air entry path. Since the polyimide resin 11 has a higher hygroscopic property than the light-shielding resin molded body 1, it is preferable that the polyimide resin 11 not be provided between the light-shielding resin molded body 1 and the first lead frame 3 from the viewpoint of preventing the entry of air. From the same viewpoint, it is preferable that the polyimide resin 11 not be provided between the light-shielding resin molded body 1 and the second lead frame 7.

If the polyimide resin 11 is provided on a surface of a member having a large area such as the first lead frame 3 and the second lead frame 7, the adhesion between members is improved, and the effect of preventing the entry of air is enhanced. In the first lead frame 3 and the second lead frame 7 having a large area, the provision of the polyimide resin 11 on a part of the surface, for example, one side as illustrated in FIG. 2, also has the effect of sufficiently improving the adhesion. When the first bonding wire 5 is coated with the polyimide resin 11b, the adhesion between members is enhanced, and it is possible to effectively prevent air from entering the light emitting surface side of the light emitting element 2.

Third Embodiment

Figure 3:
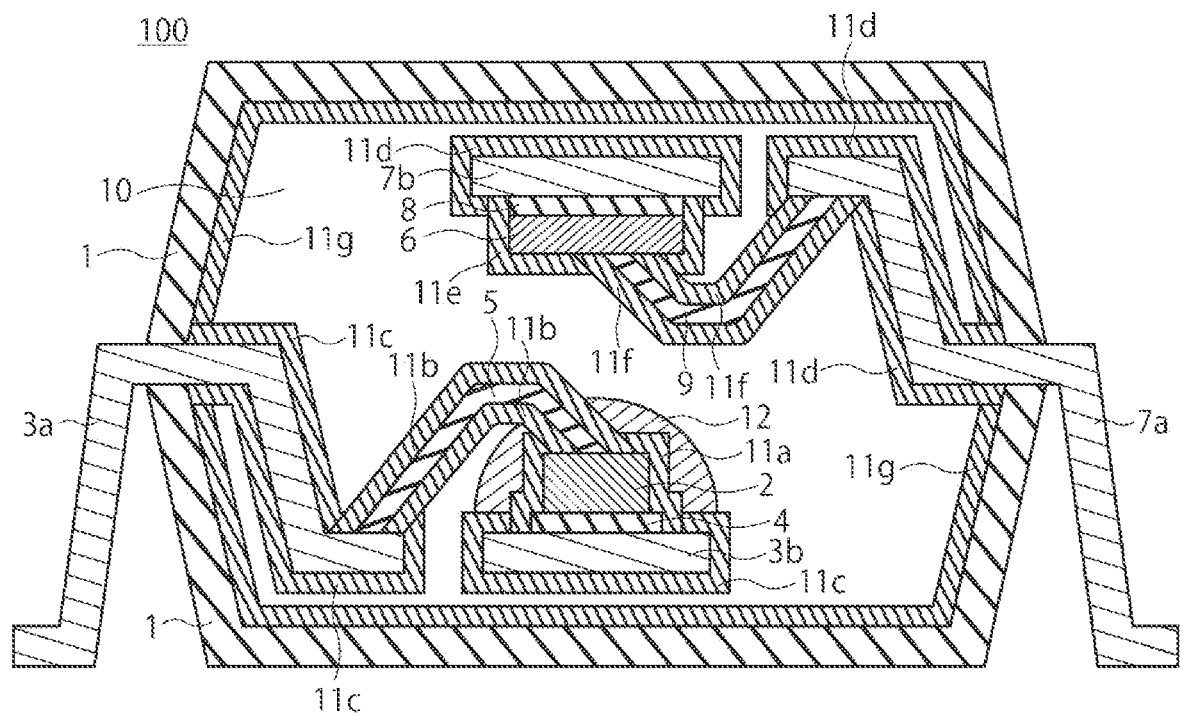
FIG. 3 is a conceptual cross-sectional view of the optical coupling device of the embodiment.

A third embodiment relates to an optical coupling device. The optical coupling device of the third embodiment is a modification of the optical coupling devices 100 and 101 of the first embodiment and the second embodiment. The description of contents common between the third embodiment and the first embodiment or the second embodiment will be omitted. FIG. 3 illustrates a conceptual cross-sectional view of an optical coupling device 102 of the third embodiment.

In the optical coupling device 102 of FIG. 3, the polyimide resin 11a is provided on a light emitting surface and a non-light emitting surface of the light emitting element 2 and a side surface of the adhesive layer 4, the polyimide resin 11b is provided on a surface of the first bonding wire 5, the polyimide resin 11c is provided on a surface of the first lead frame 3, the polyimide resin 11d is provided on a surface of the second lead frame 7, a polyimide resin 11e is provided on a surface of the light receiving element 6, a polyimide resin 11f is provided on a surface of the second bonding wire 9, and a polyimide resin 11g is provided on an inner wall of the light-shielding resin molded body 1. Since the surfaces of the internal members of the optical coupling device 102 are entirely covered with the polyimide resins 11, the adhesion between the internal members of the optical coupling device 102 can be improved.

If the polyimide resin 11e is also provided on a side surface of the light receiving element 6, stress on the side surface of the light receiving element 6 can be mitigated to prevent the light receiving element 6 from being destroyed.

In the optical coupling device 102 of FIG. 3, the light emitting element 2 coated with the polyimide resin 11a is further coated with a potting resin 12. By providing the potting resin 12, stress on the light emitting element 2 caused by a volume change of the transparent resin portion 10 can be mitigated. Since the polyimide resin 11a is provided on the light emitting surface 2 of the light emitting element 2, the expansion stress on the light emitting element 2 is mitigated even by using the potting resin 12. Thus, it is no longer necessary to provide a gap in consideration of the expansion of the potting resin 12 (the gap is reduced), light from the light emitting element 2 can efficiently reach the light receiving element 6, and deterioration in characteristics of the optical coupling device 102 caused by the use of the polyimide resin 11a is less than that in the case where the potting resin 12 is directly provided on the light emitting surface. In the embodiment, it is preferable that the polyimide resin 11 be provided between the light emitting surface of the light emitting element 2 and the potting resin 12 such that the potting resin 12 does not come into direct contact with the light emitting surface of the light emitting element 2 in the case of using the potting resin 12. The potting resin 12 is, for example, a silicone resin.

Fourth Embodiment

Figure 4:
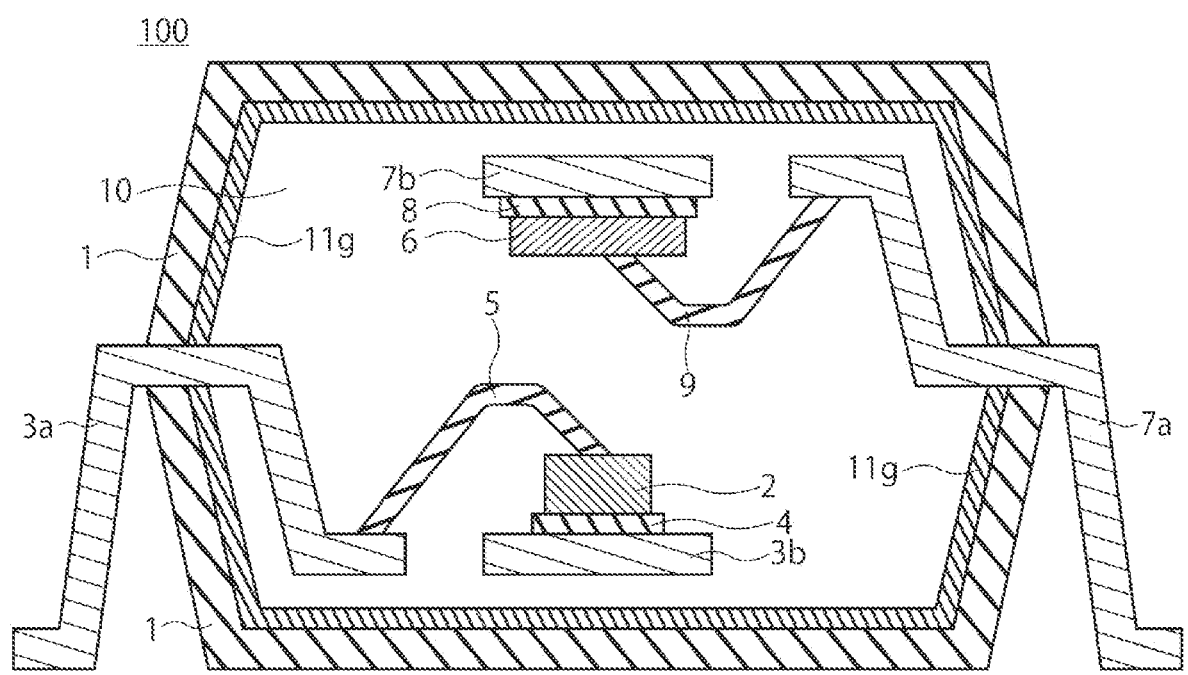
FIG. 4 is a conceptual cross-sectional view of the optical coupling device of the embodiment.

A fourth embodiment relates to an optical coupling device. The optical coupling device of the fourth embodiment is a modification of the optical coupling devices 100, 101, and 102 of the first embodiment, the second embodiment, and the third embodiment. The description of contents common between the fourth embodiment and the first embodiment, the second embodiment, or the third embodiment will be omitted. FIG. 4 illustrates a conceptual cross-sectional view of an optical coupling device 103 of the fourth embodiment.

In the optical coupling device 103 of the fourth embodiment, the polyimide resin 11g is provided on an inner wall of the light-shielding resin molded body 1 without providing the polyimide resin 11 on a light emitting surface of the light emitting element 2. The optical coupling device 103 has improved airtightness of a lead frame portion where air is likely to enter, and can suppress deterioration of internal members of the optical coupling device 103. Even in the optical coupling device 103 of the fourth embodiment, the polyimide resin 11 can be provided on the light emitting element 2, the light receiving element 6, the lead frame, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupling device comprising:
   a first lead frame;
   a light emitting element provided on the first lead frame;
   a second lead frame;
   a light receiving element provided on the second lead frame and facing the light emitting element;
   a first polyimide resin covering a light emitting surface of the light emitting element;
   a transparent resin portion provided between the light emitting element and the light receiving element;
   a light-shielding resin molded body accommodating the light emitting element and the light receiving element, and
   the first polyimide resin and the light emitting element are in direct contact with each other.

2. The device according to claim 1, wherein the first polyimide resin comprises at least one selected from a group consisting of a polyimide resin, a polyamide-imide resin, and a polyimide silicone.

3. The device according to claim 1, wherein a thickness of the first polyimide resin is 1 μm or more and 50 μm or less.

4. The device according to claim 1, wherein
the light emitting element and the first lead frame are connected by a first bonding wire,
the light receiving element and the second lead frame are connected by a second bonding wire,
a second polyimide resin is provided on a surface of the first bonding wire,
a third polyimide resin is provided on a surface of the second bonding wire, and
a distance between the first bonding wire and the second bonding wire is 300 μm or more.

5. The device according to claim 1, wherein 90 wt % or more of the first polyimide resin be one or more selected from the group consisting of the polyimide resin, the polyamide-imide resin and the polyimide silicone.

6. The device according to claim 1, wherein the transparent resin portion consists of an epoxy resin and an inorganic filler.

7. The device according to claim 1, wherein the transparent resin portion comprises an epoxy resin and an inorganic filler, an amount of a polyimide resin in the transparent resin portion is 1 wt % or less.

8. The device according to claim 1, wherein
there is no gap between the light emitting element and the polyimide resin, and
there is no gap between the light receiving element and the first polyimide resin.

9. The device according to claim 1, wherein the first polyimide resin is provided between the light emitting element and the transparent resin.

10. The device according to claim 1, wherein a fourth polyimide resin is provided on a surface of the light receiving element,
the surface of the light receiving element faces the light emitting element, and,
the fourth polyimide resin is in direct contact with the light receiving element.

11. The device according to claim 1, wherein the transparent resin is provided between the first polyimide resin and the fourth polyimide resin.

12. The device according to claim 1, wherein a fourth polyimide resin is provided on an inner wall surface of the light-shielding resin molded body.

13. The device according to claim 1, wherein a fourth polyimide resin is in direct contact with an inner wall surface of the light-shielding resin molded body and the transparent resin portion.

* * * * *